US012567218B2

(12) United States Patent
Kim et al.

(10) Patent No.: US 12,567,218 B2
(45) Date of Patent: Mar. 3, 2026

(54) AUGMENTED REALITY SYSTEM FOR A PRESS MOLD AND A CONTROL METHOD THEREOF

(71) Applicants: HYUNDAI MOTOR COMPANY, Seoul (KR); KIA CORPORATION, Seoul (KR); Korea University Of Technology And Education Industry-University Cooperation Foundation, Cheonan-si (KR)

(72) Inventors: Sanggwon Kim, Ulsan (KR); Ju Chul Kim, Ulsan (KR); Yoon Sang Kim, Seongnam-si (KR); Su Young Kim, Cheonan-si (KR); Young-Seung Lee, Seongnam-si (KR)

(73) Assignees: HYUNDAI MOTOR COMPANY, Seoul (KR); KIA CORPORATION, Seoul (KR); Korea University Of Technology And Education Industry-University Cooperation Foundation, Cheonan-si (KR)

( * ) Notice: Subject to any disclaimer, the term of this patent is extended or adjusted under 35 U.S.C. 154(b) by 146 days.

(21) Appl. No.: 18/535,169

(22) Filed: Dec. 11, 2023

(65) Prior Publication Data

US 2025/0078417 A1 Mar. 6, 2025

(30) Foreign Application Priority Data

Sep. 4, 2023 (KR) ......................... 10-2023-0117000

(51) Int. Cl.
*G06T 19/00* (2011.01)
*G06F 30/10* (2020.01)
*G06T 19/20* (2011.01)

(52) U.S. Cl.
CPC ............ *G06T 19/006* (2013.01); *G06F 30/10* (2020.01); *G06T 19/20* (2013.01); *G06T 2219/2016* (2013.01)

(58) Field of Classification Search
CPC ................... G06T 19/006; G06T 19/20; G06T 2219/2016; G06F 30/10
(Continued)

(56) References Cited

U.S. PATENT DOCUMENTS

2015/0016712 A1* 1/2015 Rhoads ................ G06V 10/462
                                                            707/769
2017/0263051 A1* 9/2017 Shipkov ................. G06T 19/20
2020/0211286 A1* 7/2020 Kelsey ................. G06T 19/006

* cited by examiner

*Primary Examiner* — David T Welch
(74) *Attorney, Agent, or Firm* — Lempia Summerfield Katz LLC

(57) ABSTRACT

An augmented reality (AR) system includes a data generator configured to generate three-dimensional (3D) data corresponding to a press mold product, and an AR terminal configured to convert the 3D data into AR data. The AR terminal includes a data inputter configured to receive the 3D data and display information corresponding to location information of each node of the 3D data. The AR terminal also includes a data processor configured to convert the 3D data into a form of polygon mesh according to a type of form information of the 3D data and generate AR data in a form of 3D virtual model through matching with the display information. The AR terminal additionally includes a data augmentation part configured to augment and match the AR data on a real product displayed on a camera image, and augment and display the display information for each node, through a user interface (UI).

17 Claims, 8 Drawing Sheets

(58) Field of Classification Search
USPC ......................................................... 345/633
See application file for complete search history.

FIG. 1

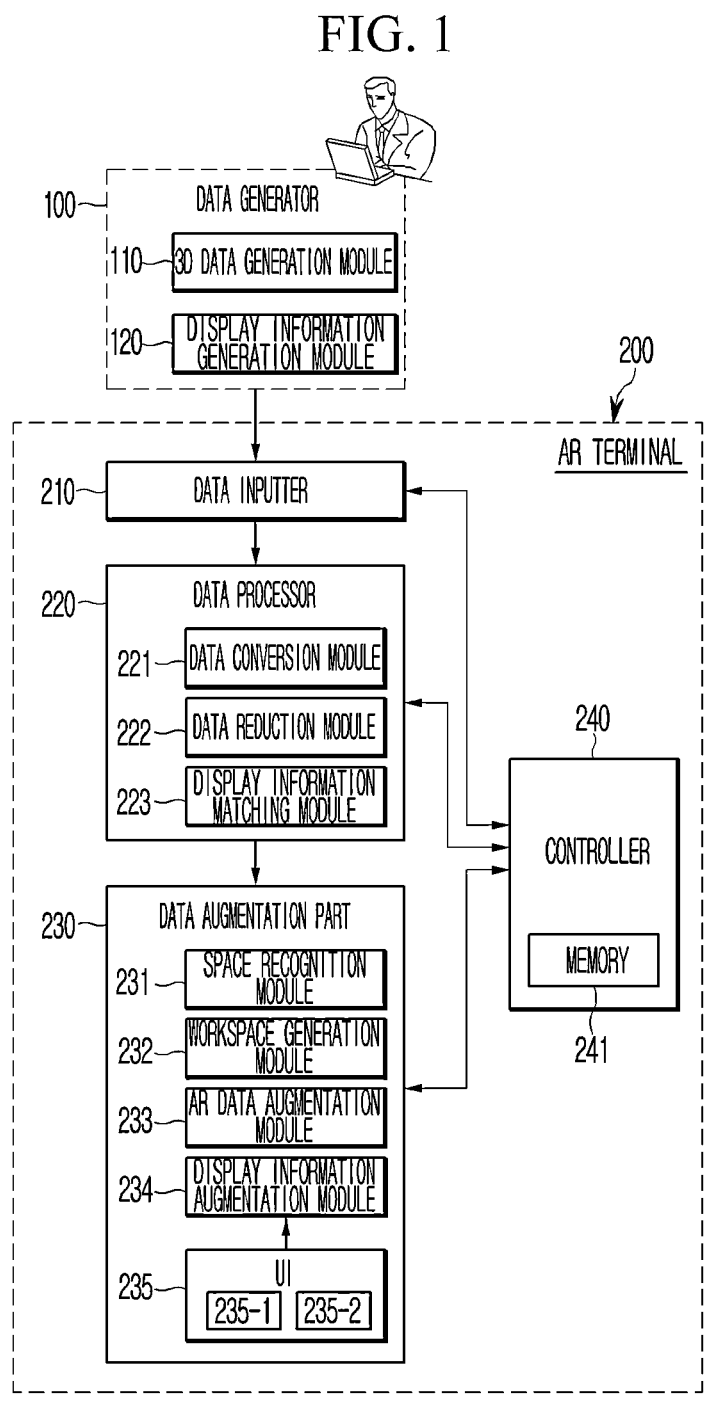

100 — DATA GENERATOR

110 — 3D DATA GENERATION MODULE

120 — DISPLAY INFORMATION GENERATION MODULE

200

AR TERMINAL

210 — DATA INPUTTER

220 — DATA PROCESSOR

221 — DATA CONVERSION MODULE

222 — DATA REDUCTION MODULE

223 — DISPLAY INFORMATION MATCHING MODULE

230 — DATA AUGMENTATION PART

231 — SPACE RECOGNITION MODULE

232 — WORKSPACE GENERATION MODULE

233 — AR DATA AUGMENTATION MODULE

234 — DISPLAY INFORMATION AUGMENTATION MODULE

235 — UI 235-1   235-2

240

CONTROLLER

MEMORY

241

(PRESENT INVENTION)

FIG. 4

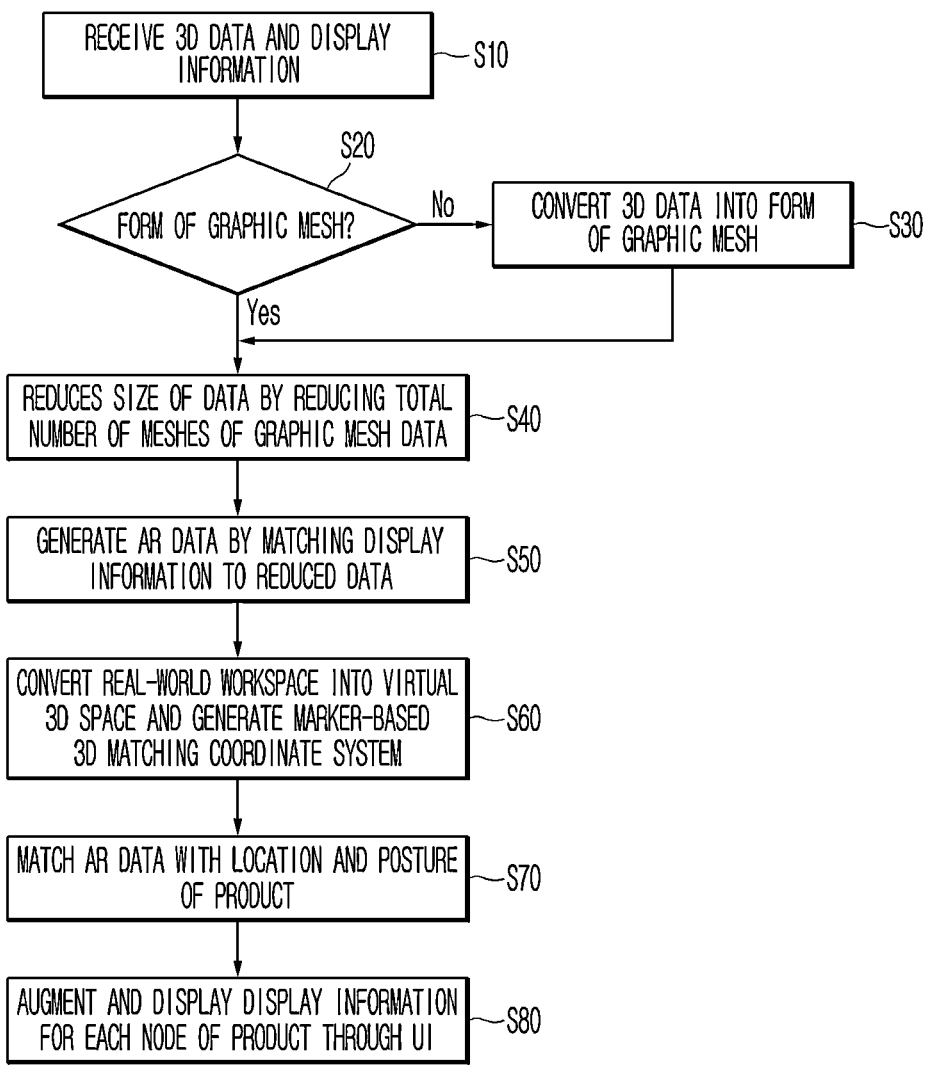

RECEIVE 3D DATA AND DISPLAY INFORMATION —S10

FORM OF GRAPHIC MESH? —S20

No → CONVERT 3D DATA INTO FORM OF GRAPHIC MESH —S30

Yes

REDUCES SIZE OF DATA BY REDUCING TOTAL NUMBER OF MESHES OF GRAPHIC MESH DATA —S40

GENERATE AR DATA BY MATCHING DISPLAY INFORMATION TO REDUCED DATA —S50

CONVERT REAL-WORLD WORKSPACE INTO VIRTUAL 3D SPACE AND GENERATE MARKER-BASED 3D MATCHING COORDINATE SYSTEM —S60

MATCH AR DATA WITH LOCATION AND POSTURE OF PRODUCT —S70

AUGMENT AND DISPLAY DISPLAY INFORMATION FOR EACH NODE OF PRODUCT THROUGH UI —S80

LEFT HAND        PRODUCT    FIRST UI

COLOR MAP    SECOND UI    RIGHT HAND    PRODUCT

AUGMENTED REALITY SYSTEM FOR A PRESS MOLD AND A CONTROL METHOD THEREOF

CROSS-REFERENCE TO RELATED APPLICATION

This application claims the benefit of and priority to Korean Patent Application No. 10-2023-0117000, filed on Sep. 4, 2023, the entire contents of which are incorporated herein by reference.

FIELD

The present disclosure relates to an augmented reality (AR) system for a press mold and a control method thereof.

BACKGROUND

In general, augmented reality (AR) is a computer graphics technique for synthesizing virtual information in a process environment that exists physically to make a virtual object appear like a real object.

In the existing manufacturing sector, most AR technologies are related to work guides using two-dimensional (2D) data.

In the case of marker-based scanning data augmentation technology, a position and posture of a press mold product may be identified using a marker-based coordinate system recognized in a camera image and three-dimensional (3D) data may be augmented.

However, data augmentation may fail when there is no marker on a camera screen or there is a recognition error (e.g., an erroneous photographing distance, a focus error, etc.), thus reducing stability.

In the case of the markerless augmentation technology, problems caused by the absence of a marker can be solved but the accuracy of a position and posture of a real product may be low and thus matching between a test product required in a molding sector and data augmentation required in the mold section may not be satisfied.

The description of the background art is made to increase understanding of the background of the present disclosure, and may include non-prior art which has already been known to those of ordinary skill in the art to which the present disclosure pertains.

SUMMARY

As discussed above, in the existing manufacturing sector, most augmented reality (AR) technologies are related to work guides using two-dimensional (2D) data. Three-dimensional (3D) engineering virtual data (obtained by, for example, a molding analysis, scanning, etc.) augmentation for assisting press mold-related work in the existing technology has not been introduced.

The present disclosure provides an AR system for a press mold and a control method thereof, in which 3D data of a product used in a press mold sector is processed into a lightweight optimized state and augmented to obtain AR data, and a 3D coordinate system is corrected by tracking a marker to improve matching with a real product.

According to an aspect of the present disclosure, an augmented reality (AR) system for a press mold is provided. The AR system includes a data generator configured to generate three-dimensional (3D) data corresponding to a press mold product. The AR system also includes an AR terminal configured to convert the 3D data into AR data to be augmented in the real world and match the AR data with a real product. The AR terminal includes a data inputter configured to receive the 3D data generated by the data generator and display information corresponding to location information of each node of the 3D data. The AR terminal also includes a data processor configured to convert the 3D data into a form of polygon mesh according to a type of form information of the 3D data and generate AR data in a form of 3D virtual model through matching with the display information. The AR terminal additionally includes a data augmentation part configured to augment and match the AR data on a real product displayed on a camera image, and augment and display the display information for each node of the 3D data through a user interface (UI). The display information for each node of the 3D data may be information collected through a molding analysis of the real product. The AR terminal further includes a controller configured to control overall operations of components applied to the AR terminal.

The data generator may include a data generation module configured to generate the 3D data including at least one of 3D engineering data generated by modeling the press mold product by a user, coordinate measuring machine (CMM) data generated by measuring a state of the real product, or 3D scanning data generated by scanning the real product. The data generator may also include a display information generation module configured to generate the display information by collecting at least one piece of attribute information among a location of each node according to a shape of the real product, a hole processing state, a curved surface, a step, a size, and a thickness and molding analysis information of the real product.

The data processor may include a data conversion module configured to identify the type of form information of the 3D data, and convert the 3D data into a form of graphic mesh when the 3D data is not in the form of graphic mesh. The data processor may also include a data reduction module configured to reduce a size of data by reducing the number of meshes of the graphic mesh input thereto. The data processor may additionally include a display information matching module configured to generates the AR data to be augmented in the real world in the form of the 3D virtual model by matching location information according to a shape of the reduced graphic mesh with the display information for each node.

The data conversion module may be configured to identify the type of form information of the 3D data, convert the 3D data into a form of graphic mesh of a polygon structure when the 3D data is in a form of 3D computer-aided design (CAD), and skip an additional data conversion process when the 3D data is in the form of graphic mesh.

The data augmentation part may include a space recognition module configured to convert a real-world workspace input through the camera image into a virtual 3D space. The data augmentation part may also include a workspace generation module configured to generate a 3D matching coordinate system based on at least one marker identified through the camera image. The data augmentation part may further an AR data augmentation module configured to bring the AR data in the real world, and augment and match the AR data with a position and posture of a product based on the 3D matching coordinate system. The data augmentation part may further still include a display information augmentation module configured to augment display information corresponding to location information of each node of the product through the UI in a state in which the AR data is augmented on the real product.

The AR data augmentation module may be configured to generate a matching coordinate system based on the added marker, and correct the position and posture of the product by correcting a space recognition-based 3D matching coordinate system using the matching coordinate system.

The display information augmentation module may be configured to augment display information by using a UI for identifying a hand of a user based on the camera image. The UI may include a user input menu for displaying at least one of an experiment, an analysis, an inspection or an evaluation of moldability of a product.

The display information augmentation module may be configured to select the user input menu according to information input through the UI, and display through a color map at least one product trend among a thickness reduction rate, panel sagging, and a plastic strain rate corresponding to each node of the AR data matched to the product.

The UI may include a first UI configured to identify a left hand of a user to check a data list to be augmented, and a second UI configured to identify a right hand of the user to select a desired data list and click a numerical value to be viewed.

According to another aspect of the present disclosure, a control method of an AR terminal applied to a press mold process is provided. The control method includes receiving 3D data corresponding to a press mold product input from a data generator and display information generated for each node of the product by analyzing the 3D data. The control method also includes converting the received 3D data into a form of graphic mesh according to a type of form information of the 3D data. The control method additionally includes generating AR data in a form of 3D virtual model through matching with the display information and matching the AR data on a real product displayed through a camera image. The control method further includes augmenting and displaying display information corresponding to location information for each node of the product through a UI in a state in which the AR data is matched.

Generating the AR data may include identifying the type of the form information of the 3D data to determine whether the 3D data is in the form of graphic mesh, and converting the 3D data into a form of graphic mesh of a polygon shape when the type of the form information of the 3D data is not the form of the graphic mesh.

Generating the AR data may further include reducing a size of graphic mesh data obtained by the converting of the 3D data by reducing the number of meshes of the graphic mesh data for graphics processing, and generating the 3D virtual model by matching the reduced graphic mesh data with the display information.

Matching the AR data may include converting a real-world workspace input through the camera image into a virtual 3D space and generating a 3D matching coordinate system based on a marker formed in advance in the workspace. Matching the AR data may also include matching the AR data with a position and posture of a product based on the 3D matching coordinate system by tracking a position of at least one marker on the camera image and bringing the AR data to the real word.

Matching the AR data with the position and posture of the product may include, whenever a marker is added to an image from a camera moving as a user's gaze is moving, generating a matching coordinate system based on the added marker, and correcting the position and posture of the product by correcting a space recognition-based 3D matching coordinate system using the matching coordinate system.

Matching the AR data with the position and posture of the product may include augmenting and matching the AR data based on pre-designated coordinates of at least one inspection port of a real product.

Augmenting and displaying the display information may include selecting a display menu according to information input through the UI based on recognition of a hand of a user. Augmenting and displaying the display information may also include displaying a product trend through a color map, the product trend including at least one of a thickness reduction rate, panel sagging, and a plastic strain rate corresponding to location information of each node of the product.

Augmenting and displaying the display information may include checking a data list to be augmented through a first UI for identifying a left hand of a user, and selecting a desired data list and clicking a numerical value to be viewed through a second UI for identifying a right hand of the user.

According to an embodiment of the present disclosure, 3D data used in a press mold sector can be converted into graphic mesh data and the number of meshes can be reduced to reduce the size of the graphic mesh data, thereby reducing data processing burden and securing the responsiveness of AR data.

Unlike the related art, even when all markers are not included in an image, a position and posture of a product can be corrected using a space recognition-based matching coordinate system by identifying additional markers to match virtual AR data to an exact location of a real-world product.

In addition, analysis information corresponding to location information of each node of a product selected through a UI based on recognition of a user's hand can be augmented and displayed to allow a user to intuitively check analysis information of a desired part of a product at a workplace.

BRIEF DESCRIPTION OF THE DRAWINGS

FIG. 1 is a schematic block diagram illustrating a configuration of an augmented reality (AR) system applied to a press mold process, according to an embodiment of the present disclosure.

FIG. 4 is a schematic flowchart of a control method of an AR system applied to a press mold process, according to an embodiment of the present disclosure.

DETAILED DESCRIPTION

Figure 2:
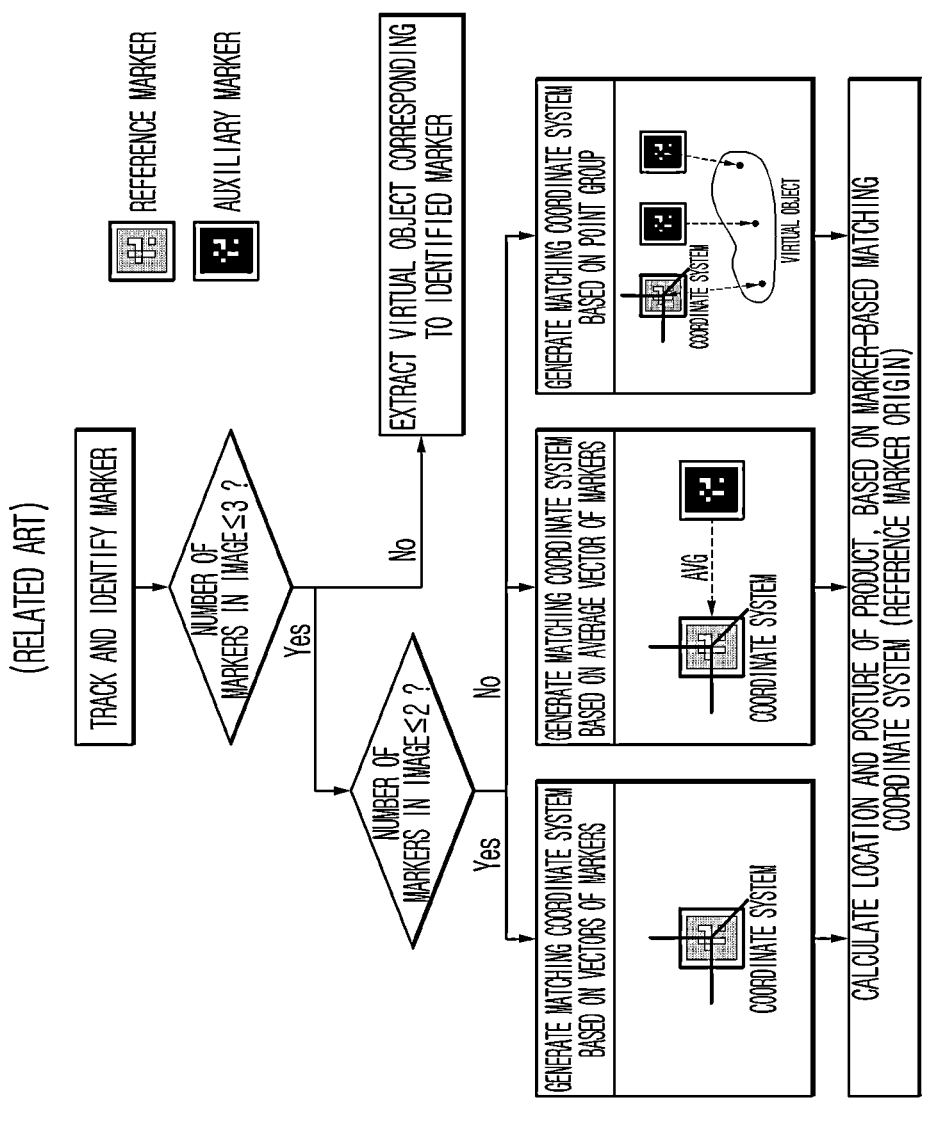
FIG. 2 illustrates a process of identifying a position and posture of a test product by a marker-based coordinate system of the related art.

Hereinafter, embodiments of the present disclosure are described in detail with reference to the accompanying drawings so that the embodiments may be implemented by those having ordinary skill in the art.

The terminology used herein is for the purpose of describing example embodiments only and is not intended to be limiting of the disclosure.

As used herein, singular forms are intended to include a plurality of forms unless the context explicitly indicates otherwise.

It should be understood that the terms "comprise" and/or "comprising", when used herein, specify the presence of stated features, integers, steps, operations, constitutional elements, and/or components, but do not preclude the presence or addition of one or more of other features, integers, steps, operations, constitutional elements, components, and/or groups thereof. As used herein, the term "and/or" includes any one or all combinations of associated listed items.

Throughout the specification, terms such as first, second, A, B, (a), and (b) may be used to describe various constituent elements, but the constituent elements should not be limited by the terms. Such terms are used only for distinguishing one component from another, and the essence of the component, an order or a sequence is not limited by the terms.

When a component is referred to as being "coupled to" or "connected" to another component, it should be understood that the component may be directly coupled to the other component, or may be connected to the other component with another component interposed therebetween.

In contrast, when a component is referred to as being "directly coupled" or "directly connected" to another component, it should be understood that no other component is interposed therebetween.

When a component, device, element, or the like of the present disclosure is described as having a purpose or performing an operation, function, or the like, the component, device, or element should be considered herein as being "configured to" meet that purpose or perform that operation or function.

The terms used herein are only used to describe certain embodiments and are not intended to limit the present disclosure.

As used herein, the singular expressions are intended to include plural forms as well, unless the context clearly dictates otherwise.

It should be further understood that one or more of methods described below or aspects thereof can be performed by at least one controller.

The term "controller" may be understood to include hardware devices such as a memory and a processor. The memory is configured to store program instructions, and the processor is specifically programmed to execute program instructions to perform one or more processes described in more detail below. As described herein, the controller may control operations of units, modules, components, devices, or the like. It should be further understood by those of ordinary skill in the art that the methods described below may be executed by an apparatus that includes a controller and one or more other components.

Hereinafter, an augmented reality system for a press mold and a control method thereof according to embodiments of the present disclosure are described in detail with reference to the drawings.

FIG. 1 is a schematic block diagram illustrating a configuration of an augmented reality system applied to a press mold process, according to an embodiment of the present disclosure.

Referring to FIG. 1, an augmented reality (AR) system for a press mold according to an embodiment of the present disclosure includes a data generator 100 that generates three-dimensional (3D) data corresponding to a press mold product (including a test product). The AR system also includes an AR terminal 200 that converts the 3D data into AR data (a 3D image) for augmenting the 3D data on the real world, matching the AR data with a position of a real product, and augmenting display information according to a product analysis.

The data generator 100 generates 3D data according to at least one of press mold product design, 3D size measurement, and scanning performed by an engineer, and display information for each of nodes according to main shape information of the 3D data. The nodes may be points on an element to which a degree of freedom required to express a behavior of an object to be measured in a finite element analysis is given. Accordingly, the nodes may be understood to mean points with location information of elements/meshes of the 3D data and display information about a molded state of a product.

Hereinafter, the "product" according to an embodiment of the present disclosure may be a "panel" molded after being put into a press mold of a body shop. However, embodiments of the present disclosure are not limited to the panel, and molded products in various industrial fields may be applied thereto.

The data generator 100 may be implemented as a computing system through which designing, product measurement, a product analysis (interpretation), etc. may be performed by an engineer.

The data generator 100 includes a 3D data generation module 110 and a display information generation module 120.

The data generation module 110 may generate 3D data including at least one of 3D engineering data generated by modeling a press mold product by an engineer, coordinate measuring machine (CMM) data generated by measuring a state (dimensions) of a real product, or 3D scanning data generated by scanning the real product.

The 3D engineering data may be generated in the form of 3D computer-aided design (CAD) by using a design tool (e.g., a commercial program). The CMM data may be data obtained by measuring a dimensional state of the product through a CMM device with respect to an inspection port.

The 3D scanning data may be generated in the form of graphic mesh based on the real product.

The display information generation module 120 generates display information corresponding to location information of each node of the 3D data generated by the data generation module 110. The display information includes attribute information, such as a location of each node, a hole processing state, a curved surface, a step, a size (area), a thickness, etc. according to a shape of the product, and molding analysis information of the real product. The attribute information may include a result of comparing and analyzing reference attribute information optimized for product mass production and actually measured attribute information.

The AR terminal 200 may be an AR-based goggle or glasses type wearable terminal with at least one RGB-depth camera. The AR terminal 200 may augment and match AR data (i.e., a 3D virtual model) corresponding to the location of a real product of the real world, which is displayed on a camera image, when mounted on a user's head. In addition, the AR terminal 200 may augment and display information for each node collected through a molding analysis of the real product.

The display information may include a product inspection menu corresponding to location information of each node during a molding analysis or quality inspection of a product produced by a press mold, and analysis information (interpretation data).

The display information may be displayed through an augmented image for each node in conjunction with a user interface (UI) of the AR terminal 200.

The AR terminal 200 includes a data inputter 210, a data processor 220, a data augmentation part 230, and a controller 240.

The data inputter 210 includes a wired/wireless communication means. The data inputter 210 receives the 3D data generated by the data generator 100 and the display information corresponding to the location information of each node, and inputs the 3D data and the display information to the data processor 220. The input 3D data that is initially input may be input in the form of 3D CAD or graphic mesh according to a generation method.

The data processor 220 converts the 3D data input from the data inputter 210 into a form of polygon mesh according to the type of shape information, and generates AR data in the form of a 3D virtual model through matching with the display information.

The data processor 220 may include a data conversion module 221, a data reduction module 222, and a display information matching module 223.

The data conversion module 221 identifies whether the type of shape information of the input 3D data is in the form of graphic mesh, and converts the 3D data into the form of graphic mesh when the 3D is not in the form of graphic mesh. For example, the data conversion module 221 may convert the 3D CAD into the form of graphic mesh of a polygonal structure when the 3D data is in the form of 3D CAD.

However, when the input 3D data is in the form of graphic mesh, the data conversion module 221 omits an additional data conversion process. In other words, additional data conversion may be omitted when the data conversion module 221 receives the form of graphic mesh as the 3D data, and may be performed only when the 3D data is not in the form of graphic mesh.

The data reduction module 222 reduces the size of data by reducing the number of meshes of a graphic mesh input by the data conversion module 221. The graphic mesh may be formed in a polygon mesh structure including at least one of a triangle or a square. The data may be heavier and may be more difficult to calculate as the number of meshes increases. Thus, when there is a delay in arithmetic processing, the responsiveness of AR data may decrease, or an afterimage may be generated when a user's gaze is moving, thus causing dizziness.

Therefore, the data reduction module 222 reduces the size of the graphic mesh to optimize the number of meshes in the graphic mesh, thereby reducing a burden of data processing and securing augmentation responsiveness.

The display information matching module 223 generates AR data in the form of a 3D virtual model by matching display information to a lightweight graphic mesh. The display information matching module 223 may generate AR data to be augmented in the real world in the form of a 3D virtual model by matching location information according to the shape of the lightweight graphic mesh with display information for each node.

The data augmentation part 230 augments and matches the AR data on an image of the real product displayed on the RGB-depth camera of the AR terminal 200. The data augmentation part 230 augments and displays display information for each node collected according to a molding analysis of the product through a UI.

The data augmentation part 230 may include a space recognition module 231, a workspace generation module 232, an AR data augmentation module 233, and a display information augmentation module 234.

The space recognition module 231 converts an image of a real-world workspace input through the camera of the AR terminal 200 into a virtual 3D space.

The workspace generation module 232 generates a 3D matching coordinate system (x, y, z) based on at least one marker identified through the camera image.

The AR data augmentation module 233 tracks the position of a marker on the camera image as the user's gaze (camera image focus) is moving, and brings AR data stored in the memory 145 to the real world in the camera image.

The AR data augmentation module 233 matches the AR data augmented in the real world to the position and posture (shape) of the product based on the 3D matching coordinate system (x, y, z).

A problem of generating a marker-based coordinate system of the related art, and a method of generating a space recognition-based 3D matching coordinate system using an improved marker according to an embodiment of the present disclosure, are described in detail below.

FIG. 2 illustrates a process of identifying a position and posture of a test product by a marker-based coordinate system of the related art.

Referring to FIG. 2, a position and posture of a product may be identified using a marker-based matching coordinate system of the related art. A marker for identification of a position and posture of a real-world product is attached to the marker-based matching coordinate system of the related art, thus allowing AR data to be matched to the product.

However, conventional techniques use one marker or use a point group matching-based matching coordinate system even when multiple markers are used.

Therefore, markers attached to a product can be identified only when the markers are included in a camera image (field of view), and cannot be identified when the markers are spaced a certain distance or more from the camera image and an area thereof decreases in the camera image, thus resulting in a matching error.

In addition, as an AR terminal is away from an initial recognition point, spatial tracking errors may accumulate, thus resulting in a reduction in matching accuracy.

Embodiments of the present disclosure improve matching accuracy by applying an improved space recognition-based product position and posture correction method when AR data is generated, unlike in the related art described above.

Figure 3:
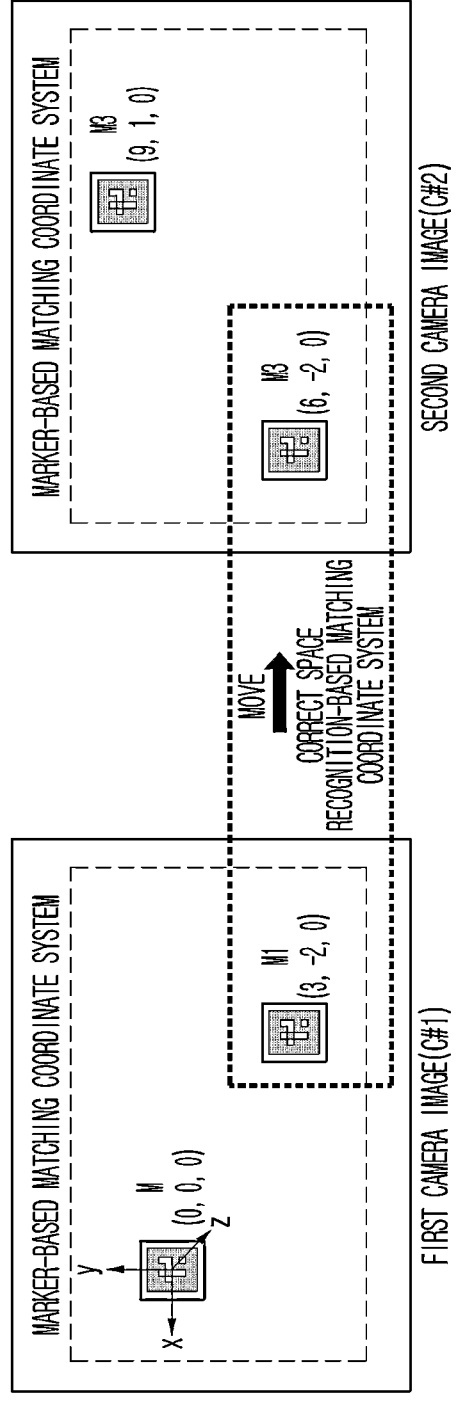
FIG. 3 is a conceptual view of a method of correcting a position and posture of a space recognition-based product, according to an embodiment of the present disclosure.

For example, FIG. 3 is a conceptual view of a method of correcting a position and posture of a space recognition-based product, according to an embodiment of the present disclosure.

FIG. 3 illustrates a first camera image C #1 before the movement of a user who is wearing an AR terminal (HoloLens2) according to an embodiment of the present disclosure or the movement of the user's gaze. FIG. 3 also illustrates a second camera image C #2 after the movement of the user or the user's gaze.

In an embodiment, in order to compensate for the problems of the marker-based matching coordinate system of the related art, the AR data augmentation module 233 may correct the space recognition-based matching coordinate system for both one reference marker M and a marker-based 3D matching coordinate system using multiple auxiliary markers M1 to M3, thereby improving the accuracy of matching.

The space recognition-based matching coordinate system may be generated by three-dimensionally recognizing the real world using added auxiliary markers, and may be used to correct the position and posture of a product based on this system.

Whenever a marker is added to an image from a camera moving as a user's gaze is moving, the AR data augmentation module 233 generates a marker-based matching coordinate system based on the added marker and corrects the position and posture of a product by correcting a space recognition-based 3D matching coordinate system using the matching coordinate system.

Therefore, unlike the related art, even when all markers are not included in an image, the AR data augmentation module 233 may correct the position and posture of a product through a space recognition-based matching coordinate system generated by identifying additional markers to augment and match virtual AR data at an exact location of a real-world product.

The display information augmentation module 234 may display information corresponding to location information of each node of the product through a UI 235 while the virtual AR data is augmented on the real product.

The display information augmentation module 234 augments the display information using the UI 235 for recognizing a user's hand based on a camera image. The UI 235 may include a user input menu for displaying at least one of an experiment, an analysis, an inspection or an evaluation of the moldability of a product.

Therefore, the display information augmentation module 234 may select the user input menu according to information input through the UI 235 for identifying a user's hand to display a product trend such as a thickness reduction rate, panel sagging, and a plastic strain rate corresponding to nodes of AR data matched to the product.

The product trend may include an overall molding state of the product. The product trend may be displayed via a color map, for example.

The UI 235 includes a first UI 235-1 for identifying a user's left hand to check a data list to be augmented, and a second UI 235-2 for identifying the user's right hand to select a desired data list and click a numerical value to be viewed.

The UI 235 may augment and display a product trend such as a thickness reduction rate, panel sagging, a plastic strain rate, etc. of a part corresponding to each node through a color map based on information input by identifying the shape of the user's left or right hand, a motion, gesture, or the like.

The controller 240 controls overall operations of the AR terminal 100 applied to a press mold product according to an embodiment of the present disclosure using at least one program and data therefor stored in the memory 241.

The controller 240 augments AR data processed by receiving 3D data used in a press mold sector, improves matching of the augmented AR data with a real product, and selectively displays an analysis result corresponding to location information of each node through a UI to maximize work efficiency of the press mold sector.

The controller 240 executes a program stored in the memory 241 to control overall operations of components applied to the AR terminal 200 and thus may operate as a practical control subject of the AR terminal 200.

The controller 240 may be implemented as including one or more processors operated according to a set program. The set program may be programmed to perform operations of a control method of an AR terminal applied to a press mold process according to an embodiment of the present disclosure.

Hereinafter, a control method of an AR system applied to a press mold process, according to an embodiment of the present disclosure, is described in more detail with reference to the following drawings.

FIG. 4 is a schematic flowchart of a control method of an AR system applied to a press mold process, according to an embodiment of the present disclosure.

Referring to FIG. 4, the control method of the AR system applied to the press mold process according to the embodiment of the present disclosure is described with an assumption that the data generator 100 i) generates 3D data according to at least one of press mold product design, 3D measurement or scanning, ii) generates display information, that corresponds to location information of each node, by analyzing the 3D data, and iii) transmits the 3D data and the display information to the AR terminal 200.

In an operation S10, the controller 240 of the AR terminal 200 receives 3D data corresponding to a press mold product, that is input from the data generator 100, and display information for each node generated by analyzing the 3D data.

In operations S20-S50, the controller 240 converts the received 3D data into a form of graphic mesh according to the type of form information of the 3D data and matches the graphic mesh with the display information to generate AR data in the form of a 3D virtual model.

Operations S20 to S50 are described in more detail below.

In the operation S20, the controller 240 identifies the type of the form information of the 3D data to determine whether the 3D data is in the form of graphic mesh.

In an operation S30, when the type of the form information of the 3D data is not in the form of graphic mesh (No in the operation S20), the controller 240 converts the 3D data into a form of graphic mesh of a polygonal shape. For example, the controller 240 may convert the 3D data into the form of graphic mesh data form when the type of the 3D data is 3D CAD.

When the type of the form information of the 3D data is in the form of graphic mesh (Yes in the operation S20), the controller 240 skips an additional data conversion process and proceeds to operation S40.

In the operation S40, the controller 240 reduces the size of the graphic mesh data by reducing the number of meshes of the graphic mesh data to be optimized for graphic processing.

In the operation S50, the controller 240 generates AR data in the form of a 3D virtual model by matching the display information described above to the reduced graphic mesh data.

In operations S60-S80, the controller 240 matches the AR data on a real product displayed on a camera image and augments display information of each node, where the display information of each node is collected as a result of a molding analysis of the product, through the node 235.

Operations S60 to S80 are described in more detail below.

In the operation S60, the controller 240 converts a real-world workspace input through a camera image into a virtual 3D space, and generates a 3D matching coordinate system based on a marker formed in advance in the workspace.

In an operation S70, the controller 240 tracks the position of at least one marker on the camera image as a user's gaze is moving and brings the AR data in the real world to match the AR data with the position and posture of a product based on the 3D matching coordinate system. In an embodiment, whenever a marker is added to an image from a camera moving as a user's gaze is moving, the controller 240 may generate a matching coordinate system based on the added marker, and may correct the position and posture of a product by correcting a space recognition-based 3D matching coordinate system using the matching coordinate system.

In addition, the controller 240 may improve matching by augmenting AR data based on pre-designated coordinates of at least one inspection port of a product in actual mass production.

In the operation S80, the controller 240 augments and displays display information corresponding to location information for each node of the product through the UI 235 while matching with the AR data.

The controller 240 may select a display menu according to information input through the UI 235 based on the recognition of a user's hand, and display a product trend, such as a thickness reduction rate, panel sagging, a plastic strain rate, etc. corresponding to the location information of each node of the product, through a color map.

Figure 5:
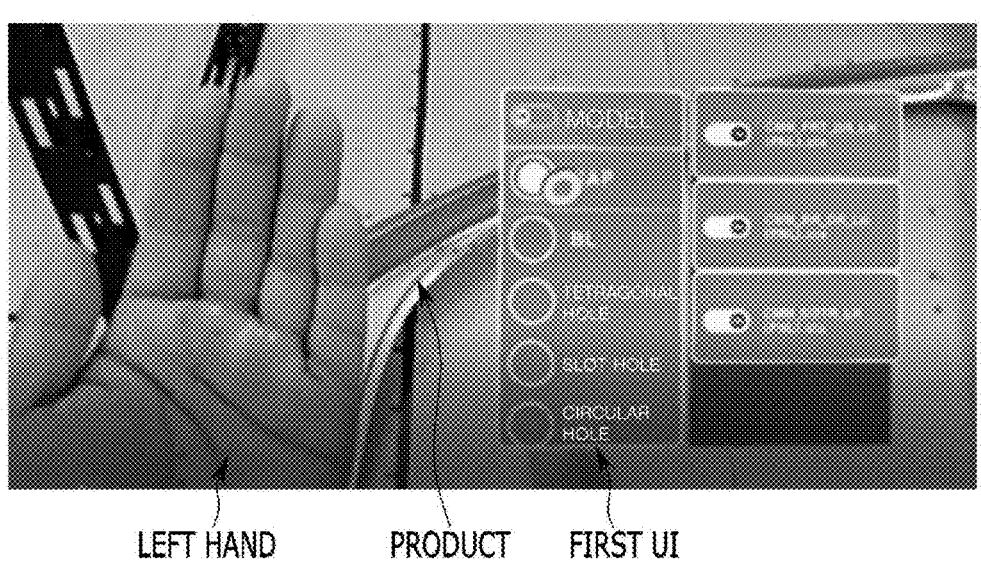
FIG. 5 is a view illustrating an operation state of a user interface (UI) when coordinate measuring machine (CMM)-based AR data is augmented on a real panel, according to an embodiment of the present disclosure.

For example, FIG. 5 is a view illustrating an operation state of a user interface (UI) when CMM-based AR data is augmented on a real panel, according to an embodiment of the present disclosure.

FIG. 5 illustrates a state in which a data result value (a gap, a hole position, or the like) measured with respect to a real panel (product) of the real world by CMM is classified according to a data type and augmented on a first UI-1 235-1 for identifying a left hand. In this case, both result values obtained by measuring the dimensions of parts connected to each other rather than a part, e.g., the augmented first UI 235-1, and a model may be augmented to grasp the relationship between the dimensions of panels.

Therefore, manpower required to write an existing panel dimension trend and numerical values on a real panel can be reduced to increase work efficiency.

Figure 6:
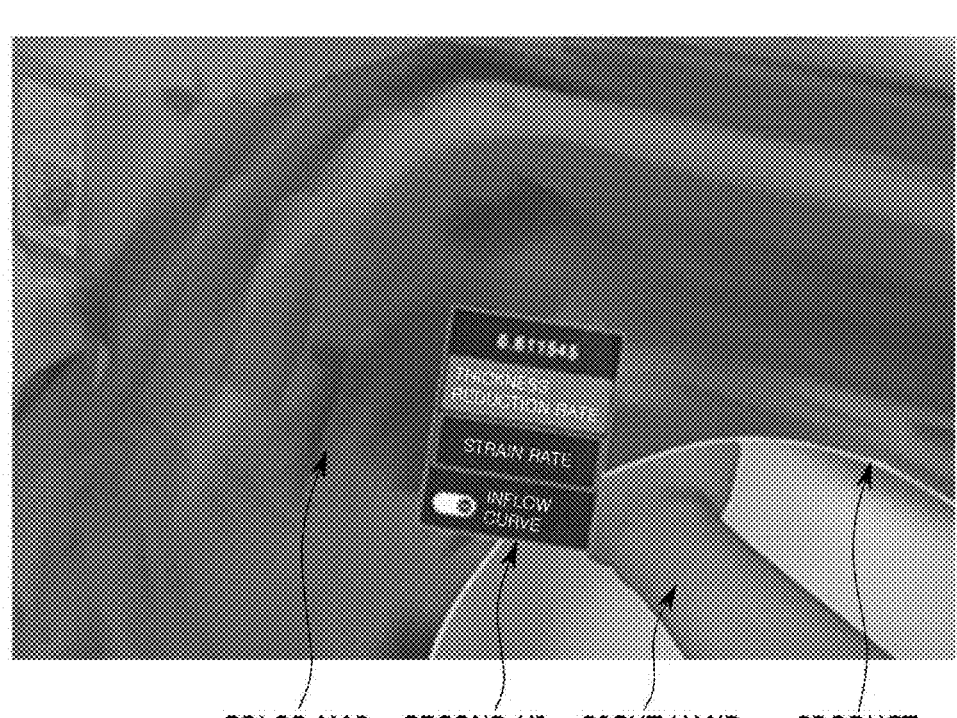
FIG. 6 illustrates a state in which an actual panel molding analysis result is augmented in the form of a color map, according to an embodiment of the present disclosure.

FIG. 6 illustrates a state in which the actual panel molding analysis result is augmented with a color map, according to an embodiment of the present disclosure.

FIG. 6 illustrates a state in which a panel trend that is a result of analyzing the moldability of a panel to confirm the moldability of the panel in advance is displayed through a color map by matching the panel trend with a real panel, according to an embodiment of the present disclosure.

According to an embodiment of the present disclosure, a thickness reduction rate, a plastic strain rate, etc. obtained through a molding analysis of the panel may be expressed in the form of a color map, so that a user may intuitively match and compare an analysis result with the actual panel and click his or her right hand with a second UI 235-2 to check a numerical value of a target area.

Therefore, it is possible to solve the problem of the related art in which after a panel is molded, the panel is checked with a naked eye or an analysis result is printed in the form of 2D image to be compared with the panel, thus making it difficult to conduct an accurate and exact analysis.

Figure 7:
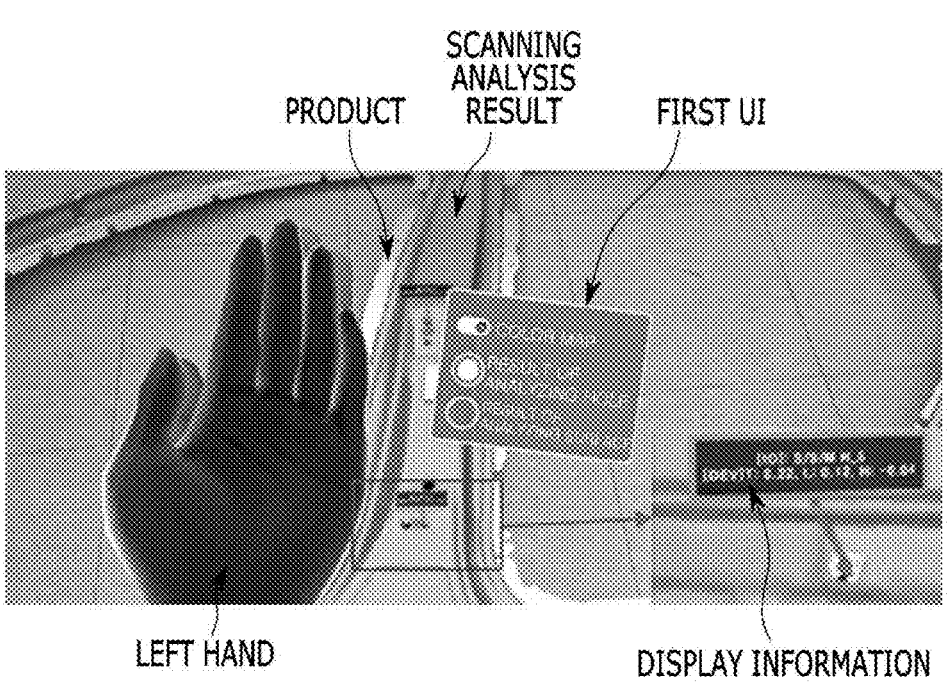
FIG. 7 illustrates a state of a UI that augments a panel scanning analysis result on a real panel, according to an embodiment of the present disclosure.

FIG. 7 illustrates a state of a UI that augments a panel scanning analysis result on a real panel, according to an embodiment of the present disclosure.

Figure 8:
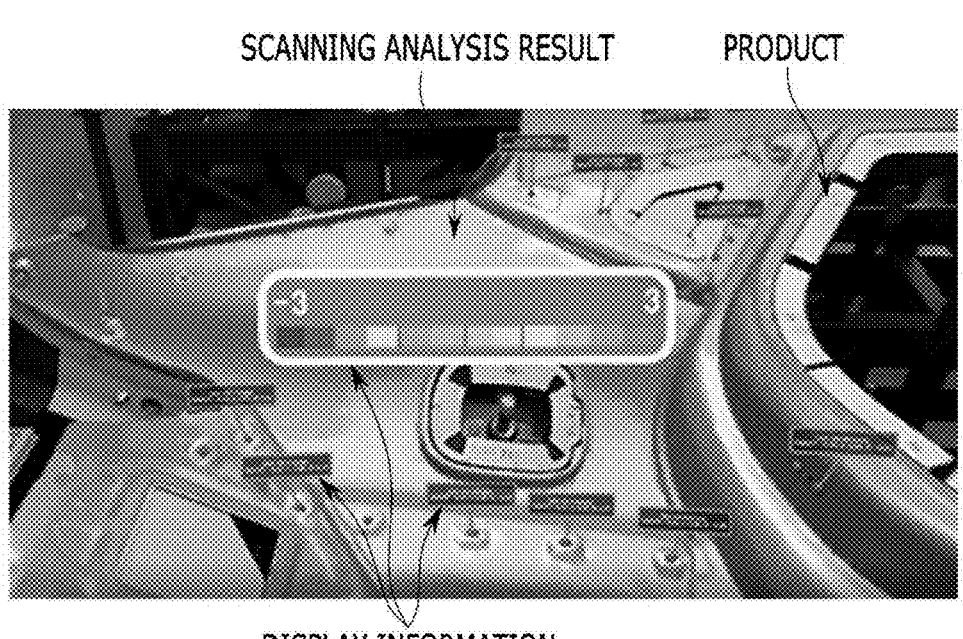
FIG. 8 illustrates a state in which panel scanning analysis results are augmented in parallel on an inspection port, according to an embodiment of the present disclosure.

FIG. 8 illustrates a state in which panel scanning analysis results are augmented in parallel on an inspection port, according to an embodiment of the present disclosure.

FIGS. 7 and 8 illustrate a state in which a molded panel (product) was placed on an inspection port to check a state thereof and an analysis result obtained by measuring a gap, a hole, and a surface state of the product by laser scanning was augmented on a real panel through a color map.

In the color map, a first color (e.g., green) part represents that the panel is in a good condition compared to a drawing, a second color (e.g., blue) part represents that the panel is sagging downward with respect to the inspection port, and a third color (e.g., red) part represents that the panel rises above the inspection port.

As described above, the AR terminal 200 may augment and display the color map representing the state of the product on the real product to allow overall states of the product to be more intuitively checked.

A user may check a data list to be augmented through a first UI 235-1 using his or her left hand.

In addition, desired content may be selected and a desired numerical value may be clicked to enlarge and check the numerical value through a second UI 235-1 using his or her right hand.

In addition, the user can intuitively check a trend of the panel through the color map augmented to match the real panel, and check a numerical value that is a measured result value of a selected part while moving a focus on the center of a camera image through control of his or her gaze.

AR data can be augmented based on a scanning analysis result obtained with respect to an inspection port used in actual mass production to increase utilization and scalability, and data consistency can be improved through pre-designated coordinates to secure a high level of consistency.

As described above, according to an embodiment of the present disclosure, 3D data used in a press mold sector can be converted into graphic mesh data and the number of meshes can be reduced to reduce the size of the graphic mesh data, thereby reducing data processing burden and securing the responsiveness of AR data.

Unlike the related art, even when all markers are not included in an image, a position and posture of a product can be corrected using a space recognition-based matching coordinate system by identifying additional markers to match virtual AR data to an exact location of a real-world product.

In addition, analysis information corresponding to location information of each node of a product selected through a UI based on recognition of a user's hand can be augmented and displayed to allow a user to intuitively check analysis information of a desired part of a product at a workplace.

Embodiments of the present disclosure may be implemented not only through the apparatus and/or method described above. Embodiments of the present disclosure may be implemented through a program for performing functions corresponding to the configuration of an embodiment of the present disclosure, a recording medium storing the program, or the like, and such an implementation can be made by those having ordinary skill in the art to which the present disclosure pertains based on the embodiments described above.

While embodiments of the present disclosure have been described in detail above, the scope of the present disclosure is not limited thereto. It should be understood that various modifications and improvements made by those of ordinary skill in the art using the basic concepts of the present disclosure defined in the following claims are included within the scope of the present disclosure.

DESCRIPTION OF SYMBOLS

| | |
|---|---|
| 100: data generator | |
| 110: 3D data generation module | |
| 120: display information generation module | |
| 200: AR terminal | 110: data inputter |
| 120: data processor | 221: data conversion module |
| 222: data reduction module | 223: display information matching module |
| 230: data augmentation part | 231: space recognition module |
| 232: workspace generating module | |
| 233: AR data augmentation module | |
| 234: display information augmentation module | 235: UI |
| 235-1: first UI | 235-2: second UI |
| 240: controller | 241: memory |

What is claimed is:

1. An augmented reality (AR) system for a press mold, the AR system comprising:

a controller comprising one or more processors; and one or more memories configured to store program instructions that, when executed by the one or more processors, cause the one or more processors to:

convert three-dimensional (3D) data corresponding to a press mold product into AR data to be augmented in a real world, wherein the program instructions, when executed by the one or more processors, cause the one or more processors to:

receive the 3D data and display information corresponding to location information of each node of the 3D data, convert the 3D data into a form of polygon mesh according to a type of form information of the 3D data, and generate AR data in a form of 3D virtual model through matching with the display information, augment and match the AR data on a real product displayed on a camera image, and augment and display the display information for each node of the press mold product through a user interface (UI), wherein the display information for each node is collected through a molding analysis of the real product.

2. The AR system of claim 1, wherein the program instructions, when executed by the one or more processors, cause the one or more processors to:

generate the 3D data including at least one of 3D engineering data generated by modeling the press mold product by a user, coordinate measuring machine (CMM) data generated by measuring a state of the real product, or 3D scanning data generated by scanning the real product, and generate the display information by collecting at least one piece of attribute information among a location of each node according to a shape of the real product, a hole processing state, a curved surface, a step, a size, and a thickness and molding analysis information of the real product.

3. The AR system of claim 1, wherein the program instructions, when executed by the one or more processors, cause the one or more processors to:

identify the type of form information of the 3D data, and convert the 3D data into a form of graphic mesh when the 3D data is not in the form of graphic mesh, reduce a size of the graphic mesh by reducing a number of meshes of the graphic mesh input thereto, and generate the AR data to be augmented in the real world in the form of the 3D virtual model by matching location information according to a shape of the reduced graphic mesh with the display information for each node.

4. The AR system of claim 3, wherein the program instructions, when executed by the one or more processors, cause the one or more processors to:

identify the type of form information of the 3D data, convert the 3D data into a form of graphic mesh of a polygon structure when the 3D data is in a form of 3D computer-aided design (CAD), and skip an additional data conversion process when the 3D data is in the form of graphic mesh.

5. The AR system of claim 1, wherein the program instructions, when executed by the one or more processors, cause the one or more processors to:

convert a real-world workspace input through the camera image into a virtual 3D space, generate a 3D matching coordinate system based on at least one marker identified through the camera image, bring the AR data in the real world, and augment and match the AR data with a position and posture of a product based on the 3D matching coordinate system, and augment display information corresponding to location information of each node of the product through the UI in a state in which the AR data is augmented on the real product.

6. The AR system of claim 5, wherein the program instructions, when executed by the one or more processors, cause the one or more processors to, whenever a marker is added to an image from a camera moving as a user's gaze is moving, generate a matching coordinate system based on the added marker, and correct the position and posture of the product by correcting a space recognition-based 3D matching coordinate system using the matching coordinate system.

7. The AR system of claim 5, wherein the program instructions, when executed by the one or more processors, cause the one or more processors to augment display information by using a UI for identifying a hand of a user based on the camera image, wherein the UI comprises a user input menu for displaying at least one of an experiment, an analysis, an inspection or an evaluation of moldability of the product.

8. The AR system of claim 7, wherein the program instructions, when executed by the one or more processors, cause the one or more processors to:

select the user input menu according to information input through the UI, and display through a color map at least one product trend among a thickness reduction rate, panel sagging, and a plastic strain rate corresponding to each node of the AR data matched to the product.

9. The AR system of claim 5, wherein the UI comprises:

a first UI configured to identify a left hand of a user to check a data list to be augmented, and a second UI configured to identify a right hand of the user to select a desired data list and click a numerical value to be viewed.

10. A control method of an augmented reality (AR) terminal applied to a press mold process, the control method comprising:

receiving three-dimensional (3D) data corresponding to a press mold product input from a data generator and display information generated for each node of the press mold product by analyzing the 3D data;

converting the 3D data into a form of graphic mesh according to a type of form information of the 3D data, and generating AR data in a form of 3D virtual model through matching with the display information;

matching the AR data on a real product displayed through a camera image; and augmenting and displaying display information corresponding to location information for each node of the press mold product through a user interface (UI) in a state in which the AR data is matched.

11. The control method of claim 10, wherein generating the AR data includes:

identifying the type of the form information of the 3D data to determine whether the 3D data is in the form of graphic mesh, and converting the 3D data into a form of graphic mesh of a polygon shape when the type of the form information of the 3D data is not the form of the graphic mesh.

12. The control method of claim 11, wherein generating the AR data further includes:

reducing a size of graphic mesh data obtained by the converting of the 3D data by reducing a number of meshes of the graphic mesh data for graphics processing, and generating the 3D virtual model by matching the reduced graphic mesh data with the display information.

13. The control method of claim 10, wherein matching the AR data includes:

converting a real-world workspace input through the camera image into a virtual 3D space and generating a 3D matching coordinate system based on a marker formed in advance in the real-world workspace, and matching the AR data with a position and posture of a product based on the 3D matching coordinate system by tracking a position of at least one marker on the camera image and bringing the AR data to a real world.

14. The control method of claim 13, wherein matching the AR data with the position and posture of the product includes:

whenever a marker is added to an image from a camera moving as a user's gaze is moving, generating a matching coordinate system based on the added marker; and correcting the position and posture of the product by correcting a space recognition-based 3D matching coordinate system using the matching coordinate system.

15. The control method of claim 13, wherein matching the AR data with the position and posture of the product includes augmenting and matching the AR data based on pre-designated coordinates of at least one inspection port of the real product.

16. The control method of claim 10, wherein augmenting and displaying the display information includes:

selecting a display menu according to information input through the UI based on recognition of a hand of a user, and displaying a product trend through a color map, the product trend including at least one of a thickness reduction rate, panel sagging, and a plastic strain rate corresponding to location information of each node of the press mold product.

17. The control method of claim 10, wherein augmenting and displaying the display information includes:

checking a data list to be augmented through a first UI for identifying a left hand of a user, and selecting a desired data list and clicking a numerical value to be viewed through a second UI for identifying a right hand of the user.

* * * * *